United States Patent
Meunier et al.

(10) Patent No.: US 9,716,383 B2
(45) Date of Patent: Jul. 25, 2017

(54) MULTIPLE SUPPLY DVFS

(71) Applicant: Optis Circuit Technology, LLC, Plano, TX (US)

(72) Inventors: Laurent Meunier, Coulaines (FR); Anders Carlsson, Lund (SE); Tomas Olsson, Karlshamn (SE)

(73) Assignee: OPTIS CIRCUIT TECHNOLOGY, LLC, Plano, TX (US)

( * ) Notice: Subject to any disclaimer, the term of this patent is extended or adjusted under 35 U.S.C. 154(b) by 657 days.

(21) Appl. No.: 14/351,169

(22) PCT Filed: Oct. 15, 2012

(86) PCT No.: PCT/EP2012/070437
§ 371 (c)(1),
(2) Date: Apr. 11, 2014

(87) PCT Pub. No.: WO2013/068205
PCT Pub. Date: May 16, 2013

(65) Prior Publication Data
US 2014/0252853 A1    Sep. 11, 2014

Related U.S. Application Data

(60) Provisional application No. 61/567,947, filed on Dec. 7, 2011.

(30) Foreign Application Priority Data

Nov. 9, 2011    (EP) .................................... 11306463

(51) Int. Cl.
*G06F 1/32* (2006.01)
*H02J 1/00* (2006.01)
(Continued)

(52) U.S. Cl.
CPC ................ *H02J 1/00* (2013.01); *G06F 1/263* (2013.01); *G06F 1/3203* (2013.01);
(Continued)

(58) Field of Classification Search
CPC ... G06F 1/26; G06F 1/263; G06F 1/32; G06F 1/3203; G06F 1/3234; G06F 1/3296;
(Continued)

(56) References Cited

U.S. PATENT DOCUMENTS

2003/0233588 A1    12/2003    Verdun
2004/0022115 A1    2/2004    Park et al.
(Continued)

FOREIGN PATENT DOCUMENTS

EP    1 993 019 A1    11/2008

OTHER PUBLICATIONS

International Search Report issued in corresponding International application No. PCT/EP2012/070437, date of mailing Jan. 28, 2013.
(Continued)

*Primary Examiner* — Levi Gannon
(74) *Attorney, Agent, or Firm* — The Danamraj Law Group, P.C.; Thomas L. Crisman; Kenneth A. McClure

(57) ABSTRACT

A system for delivering a voltage to at least one power domain has at least one component. Each power domain functions according to at least two operating points, each operating point requiring a distinct supply voltage. The system includes at least two power supply units, alternatively delivering controllable supply voltages. The system also includes a control unit that selects one of the power supply units to be connected to a power domain, based on a current operating point of the power domain. The control unit also controls the supply voltage delivered by the
(Continued)

selected power supply unit, to deliver the required voltage level associated with the current operating point of the power domain.

12 Claims, 3 Drawing Sheets

(51) Int. Cl.
*G06F 1/26* (2006.01)
*H03K 19/00* (2006.01)

(52) U.S. Cl.
CPC ....... *G06F 1/3296* (2013.01); *H03K 19/0008* (2013.01); *G06F 1/324* (2013.01); *H02J 2001/008* (2013.01); *Y02B 60/1217* (2013.01); *Y02B 60/1282* (2013.01); *Y02B 60/1285* (2013.01); *Y10T 307/352* (2015.04); *Y10T 307/675* (2015.04); *Y10T 307/696* (2015.04)

(58) Field of Classification Search
CPC .......... H02J 1/10; H02J 2001/008; H02J 9/04; H02J 9/06; H02J 9/061; Y02B 60/1282; Y02B 60/1285; Y10T 307/50; Y10T 307/305; Y10T 307/352; Y10T 307/675; Y10T 307/696
USPC ...................... 307/18, 24, 25, 28, 29, 75, 80
See application file for complete search history.

(56) References Cited

U.S. PATENT DOCUMENTS

| | | | |
|---|---|---|---|
| 2006/0259800 A1 | 11/2006 | Maejima | |
| 2008/0162770 A1* | 7/2008 | Titiano | G06F 1/3203 710/309 |
| 2008/0172565 A1 | 7/2008 | Chu et al. | |
| 2008/0201584 A1* | 8/2008 | Tatsumi | G06F 1/3287 713/300 |

OTHER PUBLICATIONS

Written Opinion of the International Searching Authority issued in corresponding International application No. PCT/EP2012/070437, date of mailing Jan. 28, 2013.

\* cited by examiner

MULTIPLE SUPPLY DVFS

BACKGROUND

Technical Field

The present invention generally relates to power supply regulation and in particular to Dynamic Voltage Frequency Scaling (DVFS).

It finds application in particular, while not exclusively, in components of an Application Specific Integrated Circuit (ASIC), a System on Chip (SoC) circuit or a microprocessor having different requirements on power supply.

Related Art

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

Reducing the power supply voltage is an efficient method to reduce all types of power consumption of a chip, for example due to switching, short circuit or leakage. However, reducing the power supply voltage for an entire chip might not be possible due to performance constraints. For example, components of an ASIC or a microprocessor have different requirements of power supply voltage due to different critical paths or clock rate.

Therefore, running some components on a lower voltage can save power without sacrificing performance, which is the basic principle of DVFS. Components (or entities) are grouped in power domains, each power domain being supplied by a dedicated power supply. It is thus possible to group together components that have lower requirement of power supply voltage, thus reducing the power voltage supplied to them.

However, standard DVFS has a limited flexibility because any entity which requires a highest operating point (defined by a voltage level and a frequency) of a given power domain will impose its requirement to the other entities of the given power domain.

Another solution is to have a dedicated power supply per entity, but the induced extra cost is too high because of the high number of regulator means, the high silicon area and the high number of pins.

For DVFS on Network on Chip (NoC), entities can be alternatively supplied by a high voltage $V_{high}$, by a low voltage $V_{low}$ or by a power supply unit that generates the local voltage for each unit.

However, such solution is constrained by requirements to have $V_{high}$ and $V_{low}$ dimensioned to support all of the entities connected to each of them, i.e. over-dimensioning of power supply units (extra silicon area). In addition, $V_{high}$ and $V_{low}$ have a fixed voltage, which is limiting the flexibility of the solution. Furthermore, having one power supply unit per entity leads to extra costs and increased complexity.

Thus, there is a need to optimize power consumption of a system comprising several components having different requirements without drastically increasing the cost of the system.

SUMMARY OF THE INVENTION

To address these needs, a first aspect of the present invention relates to a system for delivering a voltage to at least one power domain comprising at least one component, each power domain functioning according to at least two operating points, each operating point defining a required supply voltage, the required supply voltages of the operating points of a given power domain being distinct in pairs. The system comprises at least a first and a second power supply units, each supply unit being adapted to deliver a controllable supply voltage. The at least one power domain comprises at least one first power domain, which is arranged to be alternatively connected to the first or to the second power supply unit and the system further comprises a controlling unit arranged to select, among the first and second power supply units, a current power supply unit to be connected to the first power domain, the current power supply unit being selected based on a current operating point of the first power domain, the controlling unit being further arranged to control the controllable supply voltage delivered by the current power supply unit to deliver the required voltage level associated with the current operating point of the first power domain.

Therefore, the present invention enables to optimize power consumption of a System on Chip by switching between at least two power supply units depending on information varying dynamically, i.e. the operating point of a power domain, which can be connected to several domains. This avoids having a dedicated power supply unit per power domain, which is costly and space consuming. Indeed, switching between the several power supply units is entrusted to a centralized unit, i.e. the controlling unit (called DVFS Control Entity in the detailed description), which is also in charge of controlling the controllable voltage level of the several power supply units. In addition, the present invention enables more flexibility as the voltage level of at least some power supply units is controllable, thus enabling to support all of the entities connected to each of them.

According to some embodiments of the invention, a minimum voltage level and a maximum voltage level are predefined for each power supply unit and the current power supply unit is selected by the controlling unit such that the required voltage level associated with the current operating point of the first power domain is comprised between the minimum and the maximum voltage levels of the current power supply unit.

Such embodiments enable to take into account the intrinsic features of the power supply units to optimize the power consumption of the power domains.

In some embodiments, the at least one power domain is part of a set comprising at least one second power domain, the second power domain is arranged to be connected to a single voltage supply unit among the first and second supply units, and each supply voltage unit among the first and second voltage supply units delivers a voltage supply which is greater than or equal to the required supply voltage of a current operating point of each second power domain connected to the supply voltage unit.

Thus, when some power domains are dedicated to a given power supply unit, their requirements are taken into account when switching power domains that can be connected to several power supply units and when controlling the voltage level delivered by the power supply units.

According to other embodiments of the invention, a maximum current can be delivered by the first voltage supply unit and a maximum current can be delivered by the second voltage supply unit, a maximum drawn current value is defined for each power domain and the control unit predefines a default voltage supply unit for each power domain, among the first and second voltage supply units, so that the sum of the maximum drawn current values of power domains having the same default power supply unit is equal to the maximum current that can be delivered by the same default supply unit.

Such embodiments enable to dimension the power supply units and to define default power supply units for the power domains, based on the power domains that have to be supplied. By taking into account the maximum drawn current values of the power domains connected by default to a given power supply unit, the present invention ensures that there is no over-dimensioning of the power supply units.

In complement, upon change of the operating point of a first power domain from a first operating point to a second operating point, the second operating point requiring a second drawn current, if the required voltage level defined by the second operating point is higher than the required voltage level defined by the first operating point, and if the second drawn current can be drawn from the current power supply unit, then the control unit is arranged to increase the voltage level of the current power supply unit up to the required voltage level defined by the second operating point of the first power domain.

This enables to dynamically ensure the optimization of the power consumption. Indeed, as the voltage level delivered by a power supply unit is controllable according to the invention, this can be adapted to an increase of the voltage required by a given power domain, in case the power supply unit is capable of increasing the delivered voltage level.

Alternatively or in complement, upon change of the operating point of a first power domain from a first operating point to a second operating point, the second operating point requiring a second drawn current, if the required voltage level defined by the second operating point is higher than the required voltage level defined by the first operating point, and if the second drawn current can not be drawn from the current power supply unit, then the control unit is arranged to switch at least one other first power domain among the first power domains connected to the current power supply unit of the first power domain to an other power supply unit and to increase the voltage level of the current power supply unit up to the required voltage level defined by the second operating point of the first power domain.

Such embodiments also enable to dynamically ensure the optimization of the power consumption. Indeed, if in the previous case, the power supply unit is not capable of increasing the delivered voltage level, because no more current can be drawn from the power supply unit, then first power voltages, which are connected to several power supply units, can be switched to another supply unit, in order to enable the voltage level increase.

According to some embodiments, upon change of the operating point of a first power domain from a first operating point to a second operating point, the second operating point requiring a second drawn current, if the required voltage level defined by the second operating point is lower than the required voltage level defined by the first operating point, and if the required voltage level of each of the other power domains currently connected to the current power supply unit is equal to or less than the required voltage level of the first power domain, then the control unit is arranged to decrease the voltage level of the current power supply unit down to the required voltage level defined by the second operating point of the first power domain.

Such embodiments also enable to dynamically ensure the optimization of the power consumption, in case of decrease of the voltage level required by a given power domain. Indeed, by decreasing the voltage level delivered by the power supply unit (if possible), the present invention enables to ensure that the voltage level is always set to the lowest possible voltage needed to fulfil the requirements from any power domain currently connected to that power supply unit.

In complement, the control unit is further arranged to reassign at least one other first power domain connected to another power supply unit to the current power supply unit of the first power domain if the other first power domain can be supplied by the decreased voltage level of the current power supply unit.

These embodiments enable a reorganization of the first power domains after a decrease of the voltage level delivered by a given power supply unit.

In some embodiments, upon change of the operating point of a first power domain from a first operating point to a second operating point, the second operating point requiring a second drawn current, if the required voltage level defined by the second operating point is lower than the required voltage level defined by the first operating point, and if the required voltage level of at least one of the other power domains currently connected to the current power supply unit is greater than the required voltage level of the first power domain, then the control unit is arranged to reassign the at least one other power domain, if it is a first power domain, to an other power supply unit delivering a higher voltage level and to decrease the voltage level of the current power supply unit down to the required voltage level defined by the second operating point of the first power domain.

Such embodiments enable to dynamically ensure the optimization of the power consumption, in case of decrease of the voltage level required by a given power domain. Indeed, even if the voltage level delivered by a given power supply unit can not be decreased, because such a decrease would not meet the requirements of some power domains connected to this power supply unit, these power supply units can be reassigned to other power supply units, thus enabling the decrease of the voltage level delivered by the given power supply unit.

According to some embodiments, the control unit is further arranged to set the voltage level of each given power supply unit to the lowest of the required voltage levels of the power domains that are currently connected to the given power supply unit.

This enables to reduce the total consumption of the power domains, by ensuring that there is no overhead in the delivered voltage levels.

A second aspect of the invention concerns a method of delivering a voltage to at least one power domain comprising at least one component, each power domain functioning according to at least two operating points, each operating point defining a required supply voltage, the required supply voltages of the operating points of a given power domain being distinct in pairs, the method being carried out in a system comprising at least a first and a second power supply units, each supply unit being adapted to deliver a controllable supply voltage. The at least one power domain comprises at least one first power domain, which is arranged to be alternatively connected to the first or to the second power supply unit and the method is carried out by a control unit of the system and comprises:

selecting, among the first and second power supply units, a current power supply unit to be connected to the first power domain, the current power supply unit being selected based on a current operating point of the first power domain, and controlling the controllable supply voltage delivered by the current power supply unit to deliver the required voltage level associated with the current operating point of the first power domain.

According to some embodiments, the method further comprises setting the voltage level of each given power supply unit to the lowest of the required voltage levels of the power domains that are currently connected to the given power supply unit.

In some embodiments, a minimum voltage level and a maximum voltage level are predefined for each power supply unit and the current power supply unit is selected such that the required voltage level associated with the current operating point of the first power domain is comprised between the minimum and the maximum voltage levels of the current power supply unit.

According to some other embodiments, a maximum current can be delivered by the first voltage supply unit and a maximum current can be delivered by the second voltage supply unit, a maximum drawn current value is defined for each power domain and the method further comprises predefining a default voltage supply unit for each power domain, among the first and second voltage supply units, so that the sum of the maximum drawn current values of power domains having the same default power supply unit is less than the maximum current that can be delivered by the same default supply unit.

A third aspect of the invention concerns a computer program product comprising a computer readable medium having stored thereon computer program instructions loadable into a computing device and adapted to—when loaded into and executed by the computing device—cause the computing device to perform a method according to anyone the embodiments of the second aspect of the invention.

BRIEF DESCRIPTION OF THE DRAWINGS

Embodiments of the present invention are illustrated by way of example, and not by way of limitation, in the figures of the accompanying drawings, in which like reference numerals refer to similar elements and in which.

DESCRIPTION OF PREFERRED EMBODIMENTS

Figure 1A:
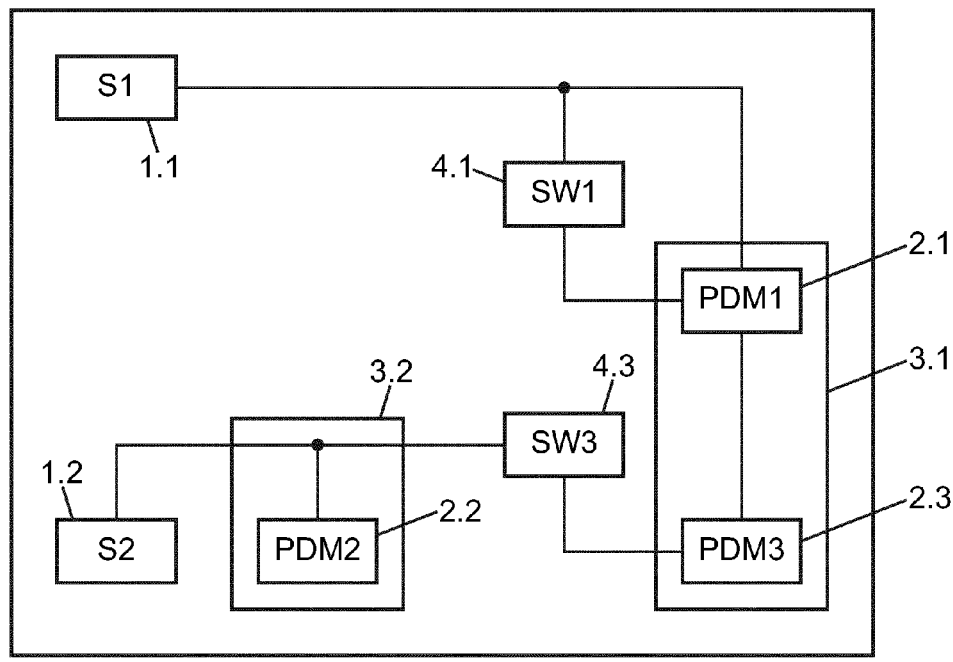
FIGS. 1*a* and 1*b* illustrate a simplified multiple-supply DVFS architecture for a System on Chip (SoC), according to some embodiments of the invention and in two different configurations.
Figure 1B:
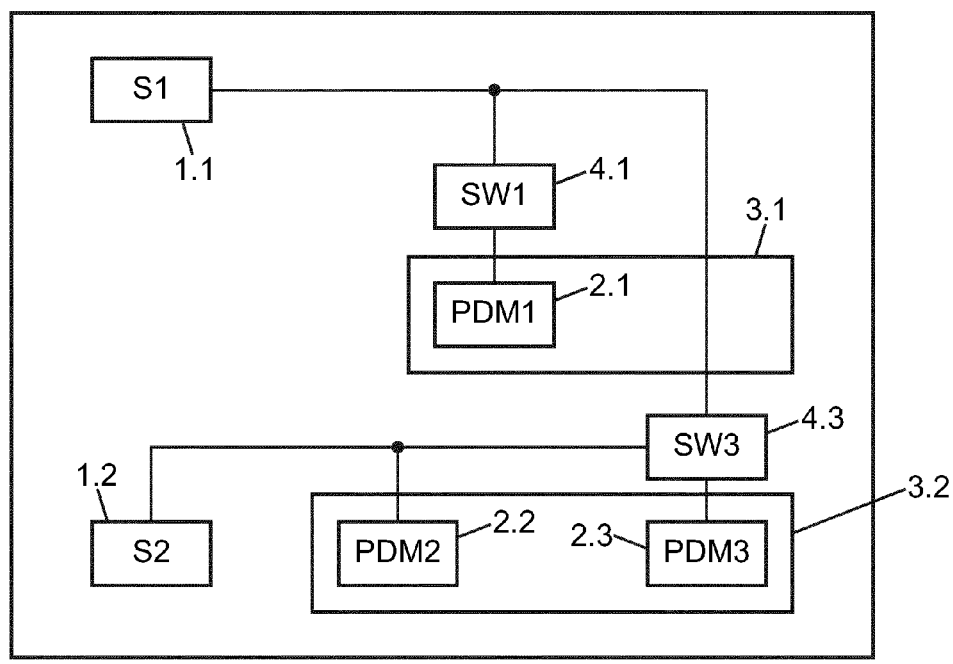

Referring to FIGS. 1*a* and 1*b*, there is shown a simplified multiple-supply DVFS architecture for a System on Chip (SoC), according to some embodiments of the invention.

The architecture comprises a first and a second power supply units 1.1 and 1.2, each power supply unit defining a voltage domain, i.e. first voltage domain 3.1 and second voltage domain 3.2 respectively. Digital entities (or components) of blocks composing the SoC are grouped in a first power domain 2.1, a second power domain 2.2 and a third power domain 2.3.

In the context of the invention, a power domain can be defined as a group of components that always share the same supply. For the sake of simplicity, the components comprised in each power domain 2.1, 2.2 and 2.3 have not been represented on FIGS. 1*a* and 1*b*.

A voltage domain 3.1 or 3.2 is based on the power supply unit 1.1 or 1.2 that can provide power to at least one power domain 2.1, 2.2 or 2.3. It is noted that the power supply units 1.1 and 1.2 can adapt the voltage they supply. The power domains 2.1, 2.2 or 2.3 that are comprised in the same voltage domain 3.1 or 3.2 share the same voltage supply.

In the example represented on FIGS. 1.*a* and 1.*b*, the first power domain 2.1 can be supplied by the first power supply unit 1.1 and the second power domain 2.2 can be supplied by the second power supply unit 1.2. The third power domain 2.3 can be supplied alternatively by the first power supply unit 1.1 or by the second power supply unit 1.2.

According to some embodiments of the invention, components of a given power domain are in the same voltage domain 3.1 or 3.2 and can share a switch, if any, to either select another voltage supply unit 1.1 or 1.2 (and thus another voltage domain) or disconnect them from any voltage supply unit 1.1 or 1.2.

Thus, each power domain 2.1, 2.2 and 2.3 can be connected to switches in order to select another power supply unit or in order to be disconnected from any power supply unit. In the example illustrated on FIGS. 1*a* and 1*b*, the first voltage domain 2.1 can be connected to a first switch 4.1, which is arranged to disconnect the first power domain 2.1 from the first power supply unit 1.1, thus enabling a switch off mode. The third power domain 2.3 can be connected to a second switch 4.3, which is arranged to select the first power supply unit 1.1 or the second power supply unit 1.2, depending on parameters that will be further explained in what follows.

Thus, according to the invention, the third power domain 2.3 is not statically assigned to a given voltage domain.

For example, in a first configuration illustrated on FIG. 1*a*, the third power domain 2.3 is switched to the first power supply unit 1.1 and thus belongs to the first voltage domain 3.1.

In a second configuration illustrated on FIG. 1*b*, the third power domain 2.3 is switched to the second power supply unit 1.2 and thus belongs to the second voltage domain 3.2.

The first power domain 2.1 can be whether switched to the first power supply unit 1.1 or disconnected from any power supply unit (for example when the components in the first power domain do not require any power, thus enabling to reduce power consumption).

According to some embodiments of the invention, supply voltage levels that are delivered by the first and second power supply units 1.1 and 1.2 can vary depending on use case. Indeed, each of the power supply unit 1.1 and 1.2 can deliver an independent voltage level which can be either equal to or different from the voltage level of the other power supply unit. The delivered voltage levels can cover the full range of SoC operating voltage, or at least a subset of it, and the retention voltage if applicable, the retention voltage being defined as a lower voltage keeping power domains in a static state without memory loss. The range of SoC operating voltage and the retention voltage supported by the digital SoC depend on the considered technology. For example, the operating range can be from 0.9 Volt (V) to 1.3V for a 40 nanometers (nm) process node in some products. No restriction is attached to the operating voltage ranges that can be covered by the present invention. In addition, each voltage domain 3.1 or 3.2 can be supplied by DCDC converters.

Furthermore, according to some embodiments of the invention, each power domain 2.1, 2.2 or 2.3 can have a list of supported Operating points (OPP). As previously explained, an OPP can be defined by a frequency and a voltage level. A power domain 2.1, 2.2 or 2.3 can have from a single OPP to a plurality of OPPs. Thus, based on a current OPP obtained after an OPP change of a given power domain connected to a power supply unit, this power domain can be switched to another power supply unit, thus enabling an optimization of the power consumption, as it will be further explained in what follows. A change in OPP can be required when the power domain has to function at a new frequency. Such a change can be initiated at a central unity controlling the system.

The switches 4.1 and 4.3, the operating point of each power domain 2.1, 2.2 and 2.3 and the voltage supplied by each power supply unit 1.1 and 1.2 can be controlled by a DVFS Control Entity (DCE), or by several DCEs, as it will be further detailed with reference to FIG. 2.

It is to be noted that no restriction is attached to the number of power domains of the SoC. Indeed, a more generic implementation of the invention will be presented with reference to FIG. 2. In addition, no restriction is attached to the number, function and type of components that are comprised in each power domain according to the invention.

Figure 2:
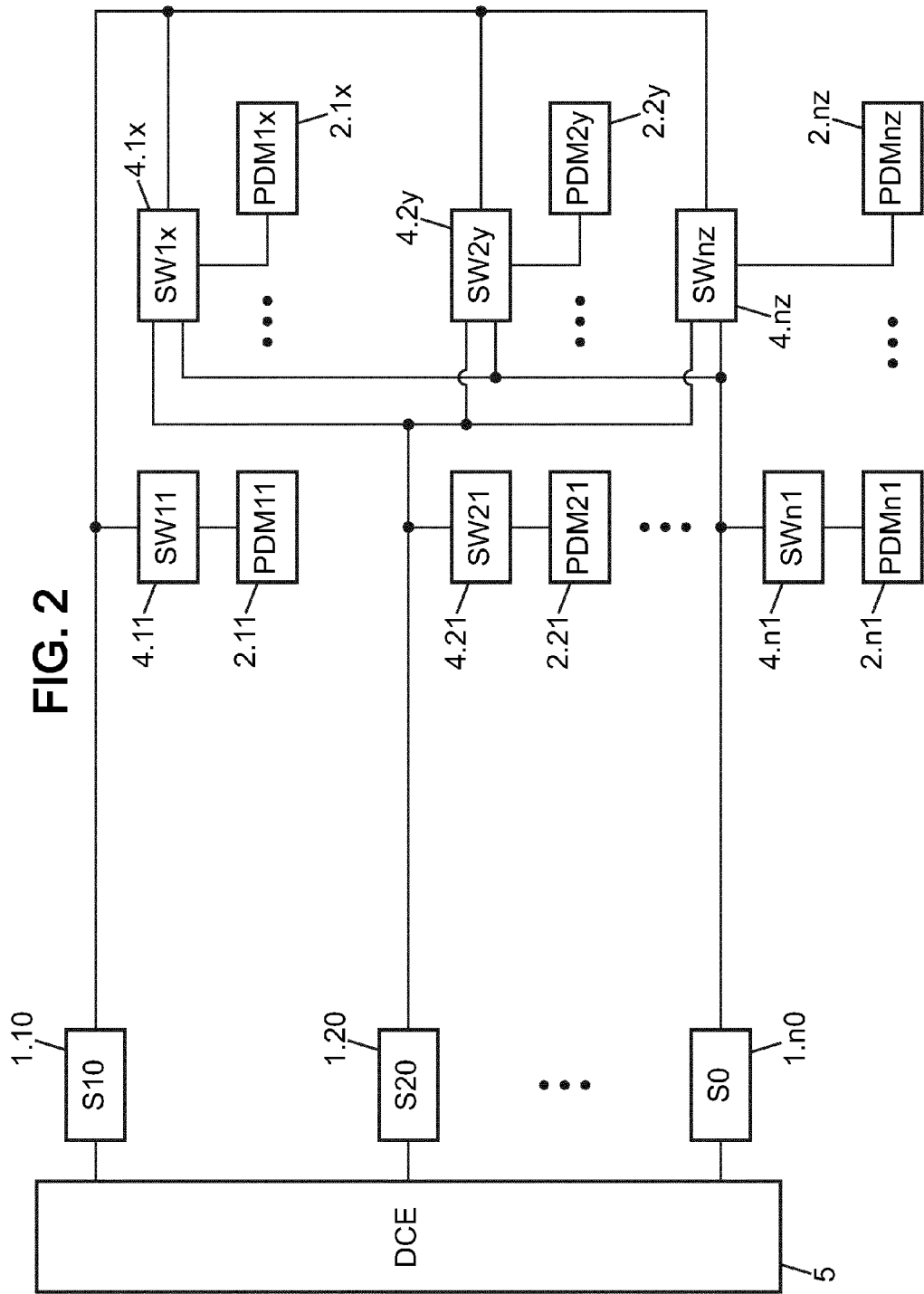
FIG. 2 represents a generic multiple supply DVFS architecture for a SoC, according to some embodiments of the invention.

Referring now to FIG. 2, there is shown a generic multiple supply DVFS architecture for a SOC, according to some embodiments of the invention.

The architecture comprises a fourth power supply unit 1.10, defining a voltage domain comprising power domains that are connected to the fourth power supply unit 1.10. In a default configuration, the fourth power supply unit 1.10 can be connected to a plurality of x fourth power domains 2.11-2.1x, x being greater or equal to two in the present example.

The architecture further comprises a fifth power supply unit 1.20, defining a voltage domain comprising power domains that are connected to the fifth power supply unit 1.20. In a default configuration, the fifth power supply unit 1.20 can be connected to a plurality of y fifth power domains 2.21-2.1y, y being greater or equal to two in the present example.

The architecture comprises an umpteenth power supply unit 1.n0, defining a voltage domain comprising power domains that are connected to the umpteenth power supply unit 1.n0. In a default configuration, the umpteenth power supply 1.n0 unit is connected to a plurality of z umpteenth power domains 2.11-2.1z, z being greater or equal to two in the present example.

n is an integer greater to or equal to 3, depending on the number of power supply units that are comprised in the architecture. No restriction is attached to the number n, according to the invention.

In what follows, we consider that n is equal to 3, and x, y, z is equal to 2, for the sake of simplicity. However, they can take any value, depending on the considered architecture.

No restriction is attached to the way a default power supply unit is defined for each given power domain. For example, a default power supply unit can be determined depending on a preferred OPP of the power domain.

As previously explained with reference to FIGS. 1a and 1b, the voltage domains according to the invention can vary dynamically depending on the switching of the different power domains, that is voltage domains, that are respectively associated with fourth, fifth and umpteenth power supply units 1.10, 1.20 and 1.n0, have not been represented on FIG. 2 for the sake of simplicity.

As previously explained, some power domains can have a switch to select another voltage domain, which differs from the default voltage domain, or to be disconnected from any voltage domain.

In the example represented on FIG. 2, the power domains 2.11, 2.21 and 2.n1 can be connected to switches 4.11, 4.21 and 4.n1 respectively. The switch 4.11 is arranged to disconnect the fourth power domain 2.1 from the fourth power supply unit 1.10 (and thus from the voltage domain associated with the fourth power supply unit 1.10), thus enabling a switch off mode. The switch 4.21 is arranged to disconnect the fifth power domain 2.21 from the fifth power supply unit 1.20, thus enabling a switch off mode. The switch 4.n1 is arranged to disconnect the umpteenth power domain 2.n1 from the umpteenth power supply unit 1.n0, thus enabling a switch off mode.

Thus, power domains 2.11, 2.21 and 2.n1 are statically assigned to a single voltage domain, with an optional switch 4.11, 4.21, 4.n1 respectively, to be turned off. Power domains 2.11, 2.21 and 2.n1 can then be grouped in a first category.

The power domains 2.1x, 2.2y and 2.nz can be connected to switches 4.1x, 4.2y and 4.nz respectively, which are arranged to select the fourth power supply unit 1.10, the fifth power supply unit 1.20 or the umpteenth power supply unit 1.n0. Thus, for example, the power domain 2.1x, which is initially connected to the fourth power supply unit 1.10, as the fourth power supply unit 1.10 is the default power supply unit of the power domain 2.1x, can be switched to the fifth power supply unit 1.20 or to the umpteenth power supply unit 1.n0 by the switch 4.1x. The power domain 2.2y, which is initially connected to the fifth power supply unit 1.20, as the fifth power supply 1.20 unit is the default power supply unit of the power domain 2.2y, can be switched to the fourth power supply unit 1.10 or to the umpteenth power supply unit 1.n0 by the switch 4.2y. The power domain 2.nz, which is initially connected to the umpteenth power supply unit 1.n0, as the umpteenth power supply unit 1.n0 is the default power supply unit of the power domain 2.nz, can be switched to the fifth power supply unit 1.20 or to the fourth power supply unit 1.10 by the switch 4.nz.

Thus, the power domains 2.1x, 2.2y and 2.nz are each connected to a switch that enables to select any of the n power supply units, and can then be grouped in a second category. No restriction is attached to the way the switches are built. For example, each switch can be built based on several switches. In addition, some power domains can also be connected to an intermediate number of power supply units, comprised between 1 and n.

The architecture represented on FIG. 2 also comprises a DCE 5, which is connected to the switches, the power domains and the power supply units (only a connection between the DCE 5 and the power supply units has been represented on FIG. 2, for the sake of simplicity).

The DCE 5 is designed to select a given OPP for each power domain (based on a required frequency to operate for this power domain for example) and can control the switches connected to each power domain in order to assign them an adequate voltage domain. An adequate voltage domain is a voltage domain that can fulfil the requirements of the power domain in the given OPP and that minimizes the power consumption, as it will be further explained in what follows. In addition, the DCE 5 can be supplied by one or several power supply units or may also have an independent supply. According to some embodiments of the invention, the DCE 5 can be a single hardware component or can be split into several sub-parts that are possibly spread over several power domains. The DCE 5 can also be in charge of programming the voltage domains, and thus controlling the supply level the power supply units 1.10, 1.20 and 1.n0.

It is to be noted that the DCE 5 can be implemented in hardware, software or mix of both.

The architecture represented on FIG. 2 depends on a careful system analysis in order to determine how is should be partitioned into power domains and how the power domains should be connected to the voltage domains. Such system analysis can lead to optimization choices, such as not connecting every power domain to all the power supply units. For example, the architecture can be simplified by limiting the number of inputs of a power domain to a subset of power supply units or to a single power supply unit.

As already explained, the power domains can be divided into two following categories, which are hereafter noted:
  category A: power domains that are statically assigned to a single voltage domain with optional off switch, such as power domains 2.11, 2.21 and 2.n1 on FIG. 2;
  category B: power domains that are connected to a switch between a default voltage domain and a least one other voltage domain, and with optional off switch, such as power domains 2.1x, 2.2y and 2.nz on FIG. 2;

According to some embodiments of the invention, and to further reduce the power consumption, the sorting into categories can be made with emphasis on differentiating the supply voltage need of the different power domains, such as, for instance:
  power domains that constantly demand high supply level can be grouped in category A;
  power domains that constantly demand low supply level can be grouped in category A, but preferably in a single voltage domain which is different from the voltage domain of high supply level power domains;
  power domains with intermediate or varying demand of supply level can be grouped in category B.

In what follows, an estimate of the current drawn by a power domain in a given OPP is known and is noted $I_{oppPDM}$ in what follows. A maximum current required by each power domain PDM in worst case conditions is known and is noted $I_{maxPDM}$ in what follows. $I_{maxPDM}$ corresponds to the maximum value of $I_{oppPDM}$ for a given power domain.

In addition, the following notation is used to designate power domains: power domain 2.11 is noted PDM11, power domain 2.21 is noted PDM21, power domain 2.nz is noted PDMnz, etc.

In order to dimension the power supply units, the OPP that requires the maximum current, for each power domain, is considered. In the following example, each power domain is assigned to a default voltage domain. For example, by considering the power domains 2.11 to 2.1x, with now x that is greater than or equal to three, and which have the voltage domain associated with the fourth power supply unit 1.10 as default voltage domain, the equation below is respected:

$$VDM10\text{maxcurrent} = I_{maxPDM11} + I_{maxPDM12} + \cdots + I_{maxPDM1x};$$

where VDM10maxcurrent is the maximum current that can be delivered by the fourth power supply unit 1.10.

The same equation applies for the fifth and the umpteenth power supply units 1.20 and 1.n0:

$$VDM20\text{maxcurrent} = I_{maxPDM21} + I_{maxPDM22} + \cdots + I_{maxPDM2y}; \text{ and}$$

$$VDMn0\text{maxcurrent} = I_{maxPDMn1} + I_{maxPDMn2} + \cdots + I_{maxPDMnz}$$

with y and z that are now greater than or equal to three; and where VDM20maxcurrent is the maximum current that can be delivered by the fifth power supply unit 1.20;

where VDMn0maxcurrent is the maximum current that can be delivered by the umpteenth power supply unit 1.n0.

The previous equations can ensure that there is no over-dimensioning of the power supply units and this is a removed limitation compared to the DVFS on NoC according to the prior art, in which all supplies are over-dimensioned.

Figure 3:
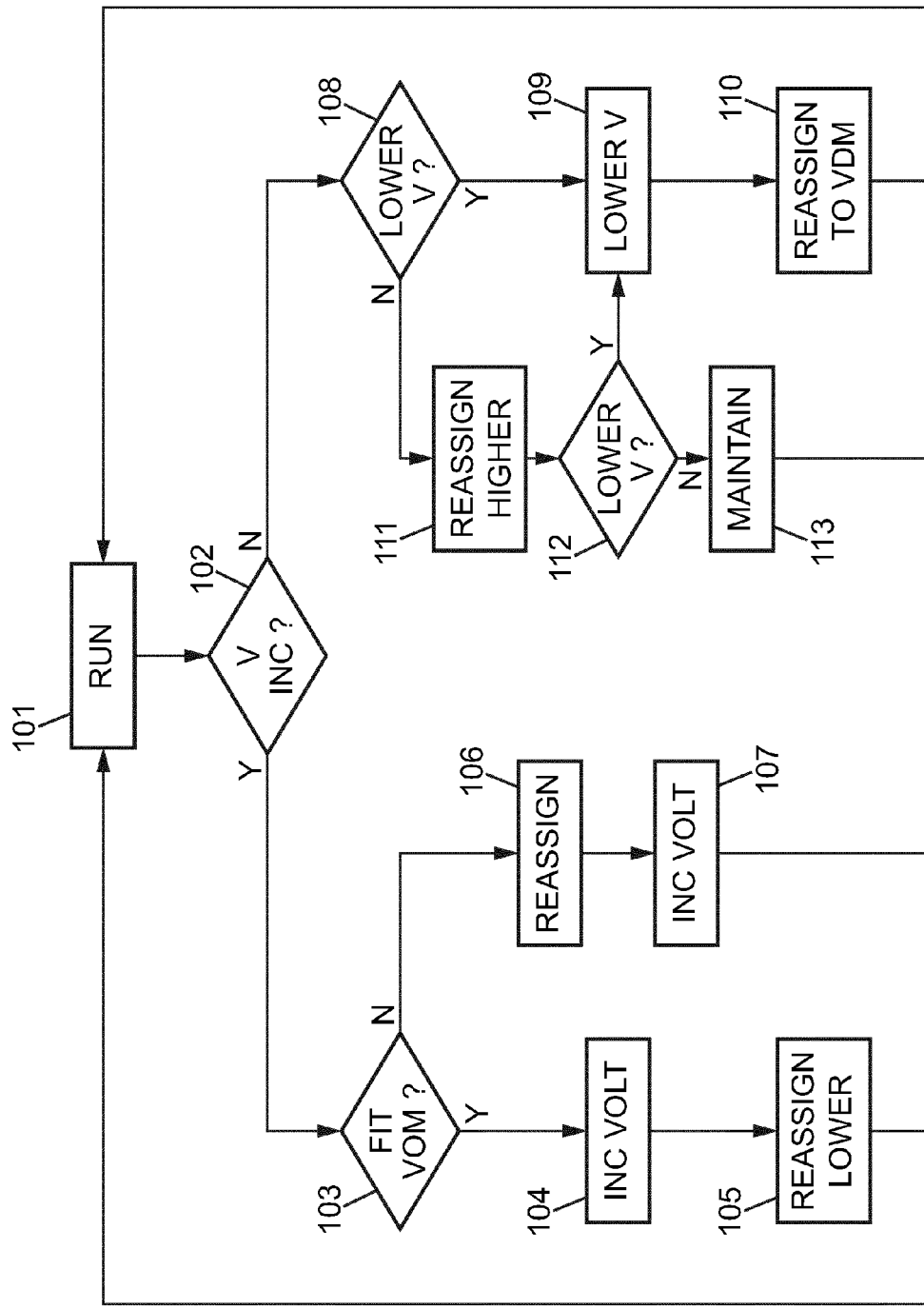
FIG. 3 illustrates a flowchart representing the steps of a method of regulating power consumption by a DVFS Control Entity according to some embodiments of the invention.

Referring now to FIG. 3, there is shown a flowchart representing the steps of a method of regulating power consumption by the DCE 5 according to some embodiments of the invention.

The DCE 5 can take into account the following Tables to optimize the selection of a voltage domain (power supply unit) for each power domain:

TABLE 1

Voltage domain properties.

| VDM | Min Voltage | Max Voltage | Max Current | Retention Voltage |
|---|---|---|---|---|
| 10 | 0.9 V | 1.3 V | 100 | — |
| 20 | 1.0 V | 1.0 V | 20 | 0.7 V |
| ... | ... | ... | ... | ... |
| n0 | 1.5 V | 1.8 V | 10 | — | where VDM refers to the power supply units which indexes have been introduced with reference to FIG. 2;

where Min Voltage represents the minimum voltage that can be generated by each VDM;

where Max Voltage represents the maximum voltage that can be generated by each VDM;

where Max Current is the maximum current that can be delivered by each VDM (corresponding to the previously introduced VDM10maxcurrent, VDM20maxcurrent and VDM30maxcurrent);

where Retention Voltage is the value of the retention voltage (if any) for each VDM;

TABLE 2

Current drawn by each power domain for a given operating point.

| PDM | VoltageStep1 | VoltageStep2 | ... | VoltageStepM |
|---|---|---|---|---|
| 11 | $I_{opp11\_1}$ | $I_{opp11\_2}$ | ... | $I_{opp11\_M}$ |
| 21 | — | — | ... | $I_{opp21\_M}$ |
| ... | ... | ... | ... | ... |
| nz | — | $I_{oppnz\_2}$ | ... | $I_{oppnz\_M}$ | where PDM refers to the power domains which indexes have been introduced with reference to FIG. 2;

where VoltageStep1 represents an operating point associated with a first required voltage level;

where VoltageStep2 represents an operating point associated with a second required voltage level;

where VoltageStepM represents another operating point associated with a required voltage level of index M, M being greater than or equal to 3 in this specific example.

$I_{opp11\_1}$ corresponds to the value $I_{oppPDM}$ introduced before, for the power domain 2.11 in the operating point VoltageStep1.

However, no restriction is attached to the number of operating points associated with each power domain. Table 2 enables to obtain the current drawn by a given power domain for a given OPP, and can be used by the DCE 5 to optimize the power consumption of the system, as it will be now explained by referring back to FIG. 3.

At an initial step 101, each power domain is connected to a given power supply unit VDM (for example the default power supply unit of each power domain). Thus, the power domain 2.1x, hereafter noted PDM1x, can be initially connected to the fourth power supply unit 1.10.

The DCE 5 can then determine that a change in the current OPP of the power domain PDM1x (for example) is necessary. This can be controlled by the DCE 5 or any control unit detecting a requirement to change the operation frequency of the power domain PDM1x, for example. As previously explained, the new current OPP (noted current OPP hereafter) is associated with an operation frequency and a voltage level. Based on the new current OPP that defines a frequency/voltage pair, the DCE 5 can determine at a step 102, whether the voltage level that is required by the power domain PDM1x is increasing for the current OPP compared to the previous OPP of the power domain PDM1x. The DCE 5 also determines the current drawn by the first power domain PDM1 in the current OPP, which is noted $I_{oppPDM1x\_k}$, where k is comprised between 1 and M.

If the voltage level is increasing, the DCE 5 can determine at a step 103 whether the value $I_{oppPDM1x\_k}$ is compatible with the maximum current that can be delivered by the fourth power supply unit 1.10. Such compatibility is calculated by summing all the currents $I_{oppPDM}$ that are drawn by the power domains currently belonging to the voltage domain associated with the fourth power supply unit 1.10 (comprising at least the power domain 2.11, noted PDM11 hereafter, as it belongs to category A), in their respective operating points, and comparing the calculated sum with the maximum current that can be delivered by the fourth power supply unit 1.10, namely VDM10maxcurrent, which can be obtained by the DCE 5 by consulting Table1.

If the value $I_{oppPDM1x\_k}$ is compatible with the maximum current that can be delivered by the fourth power supply unit 1.10, then the voltage of the fourth power supply unit 1.10 can be increased at a step 104, in order to be adapted to the current OPP of the power domain PDM1x. To increase the voltage level, the DCE 5 can consult Table 1 and in particular the values Min Voltage and Max Voltage that are associated with the fourth power supply unit 1.10 (VDM10). Then, at a step 105, the other power domains of category B belonging to the voltage domain associated with the fourth power supply unit 1.10 can be assigned by the DCE 5 to other power supply units delivering a lower voltage level. Then, the method is iterated by coming back to step 101 until a new OPP change for the first power domain PDM1 or for any other power domain is required.

If the value $I_{oppPDM1\_k}$ is not compatible with the maximum current that can be delivered by the fourth power supply unit 1.10, then power domains of category B belonging to the voltage domain associated with the power supply unit 1.10 can be reassigned by the DCE 5 at a step 106 to other power supply units, if possible (if the voltage levels delivered by the other power supply units match with the requirements of the power domains of category B). In addition, if power domains of category A or B are not currently used or can be placed in a static state, they can be switched off, in order to reduce power consumption. Then, after reassignment of some of the other power domains, the voltage level of the fourth power supply unit 1.10 can be increased by the DCE 5 at a step 107, in order to be adapted to the current OPP of the power domain PDM1x. To increase the voltage level, the DCE 5 can consult Table 1 and in particular the values Min Voltage and Max Voltage that are associated with the fourth power supply unit 1.10 (VDM10). Then, the method can be iterated by coming back to step 101 until a new OPP change for the power domain PDM1x or for any other power domain is required.

If it has been determined at step 102 that the required voltage level is decreasing for the current OPP compared to the previous OPP of the power domain PDM1x, then the DCE 5 can check at a step 108 whether it is possible to decrease the voltage level delivered by the fourth power supply unit 1.10. To this end, the DCE 5 checks whether a lower voltage level can be sufficient to fulfil the requirements of the OPP of the other power domains connected to the fourth power supply unit 1.10.

If it is determined at step 108 that the voltage level of the fourth power supply unit 1.10 can be decreased, then the DCE 5 can decrease at a step 109 the voltage level of the fourth power supply unit 1.10, thus reducing the power consumption of the architecture. Then, at a step 110, power domains of category B of other voltage domains can be reassigned to the fourth power supply unit 1.10, if their power requirements match the voltage level generated by the fourth power supply unit 1.10. Then, the method can be iterated by coming back to step 101 until a new OPP change for the power domain PDM1x or for any other power domain is required.

If it is determined at step 108 that the voltage level of the fourth power supply unit 1.10 cannot be decreased (for example because of power requirements of the other power domains that are connected to the fourth power supply unit 1.10), then the DCE 5 can reassign power domains of category B currently connected to the fourth power supply unit 1.10 to other power supply units at step 111. In particular, the power domains having the higher requirements (higher required voltage levels) can be reassigned, so that the voltage delivered by the fourth power supply unit 1.10 can be decreased, without impacting on the operation of the components of the power domains. After reassignment of power domains to other power supply units (assuming that in some use cases, such reassignments are not possible), the DCE 5 can check again at a step 112, whether it is possible to decrease the voltage level delivered by the fourth power supply unit 1.10 (which is only possible if reassignments have been performed at step 111). If the voltage level can be decreased, then step 109 is performed.

If it has been determined at step 112 that the voltage level generated by the fourth power supply unit 1.10 can not be decreased, then the voltage level is maintained at step 113 and the method can be iterated by coming back to step 101 until a new OPP change for the power domain PDM1x or for any other power domain is required.

Thus, upon each change of OPP for one power domain, the DCE 5 is in charge of reassigning power domains by taking into account several criteria. On the one hand, the voltage level of each power supply unit can be set by the DCE 5 so that:

the voltage level of a power supply unit is set to a supported voltage step between the minimum supported voltage Min Voltage and the maximum supported voltage Max Voltage as it is stored in Table 1;

each given power supply unit provides a voltage level which is at least equal to the voltage level required by any power domain of category A, for which the given power supply unit is the default power supply unit;

the delivered voltage level of each power supply unit can be set to the lowest possible voltage needed to fulfil the requirement of each power domain currently assigned to this power supply unit.

On the other hand, at each OPP change, the DCE 5 can reassign the selection of power domains of category B in order to minimize system power consumption, based on some or all of the following rules for optimization:

include dynamic power for all components based on the current drawn by the power domain in a given OPP ($I_{oppPDM}$);

include static power (leakage) for all components;

include loss in power supply units by taking into consideration the current drawn by the power domains connected to each regulator compared to optimum load current for optimum efficiency;

ensure that the sum of the current (IOPPPDM drawn by the power domains connected to a given power supply unit is less that the maximum current that can be delivered by the given power supply unit (VDMmaxcurrent));

optimizing the efficiency of the power supply units by ensuring optimal load.

Thus, the DCE 5 enables to optimize power consumption, where total power (noted Total Power) is estimated to:

$$TotalPower = \sum_{i=1}^{n}\left[\frac{VDMvolt(i)}{VDMeff(i)} \times \sum_{PDM}(I_{oppPDM} + I_{staticPDM})\right]$$

where VDMvolt(i) is the supply voltage level delivered by power supply unit 1.i0;

where VDMeff(i) is the efficiency of the power supply unit 1.i0;

$$\sum_{PDM}$$

means that the sum is calculated for all the power domains of the system;

$I_{oppPDM}$ is the dynamic component of the current drawn by a power domain of the system in a given operating point;

$I_{staticPDM}$ is the static component of the current drawn by a power domain of the system in a given operating point.

By implementing the steps of the flowchart represented on FIG. 3, the DCE 5 according to the invention can optimize platform power compared to standard DVFS system.

Indeed, being able to use different voltage levels for different components grouped in power domains has a great importance for low-power designs. However, overhead components in the systems according to the prior art, associated with different voltage levels are costly in terms of silicon area, extra delay and power consumption in order to make different voltage levels a viable solution. The present invention thus enables a flexible DVFS strategy at a moderate cost in area and power overhead.

Embodiments of the present invention can also be embedded in a computer program product, which comprises all the features enabling the implementation of the methods described herein, and which—when loaded in an information processing system—is able to carry out these methods. Computer program means or computer program in the present context means any expression, in any language, code or notation, of a set of instructions intended to cause a system having an information processing capability to perform a particular function either directly or after conversion to another language. Such a computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

Embodiments of the invention have been described above in detail with reference to embodiments thereof. However, as is readily understood by those skilled in the art, other embodiments are equally possible within the scope of the present invention, as defined by the appended claims.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, some embodiments of the present invention may not include all of the features described above. Therefore, it is intended that the present invention not be limited to the particular embodiments disclosed, but that the invention include all embodiments falling within the scope of the invention as broadly defined above.

A person skilled in the art will readily appreciate that various parameters disclosed in the description may be modified and that various embodiments disclosed and/or claimed may be combined without departing from the scope of the invention.

The invention claimed is:

1. A system for delivering voltages to power domains, each power domain having at least one component and functioning according to at least two operating points at distinct required supply voltages, the system comprising:

a first power supply unit and a second power supply unit configured, to deliver controllable supply voltages, wherein the first power supply unit is able to deliver a first maximum current and the second power supply unit is able to deliver a second maximum current;

a first power domain, which is arranged to be alternatively connected to the first power supply unit or to the second power supply unit, wherein a maximum drawn current value is defined for each of the first power domain and a second power domain; and a control unit configured to select one of the first power supply unit and the second power supply unit to be a current power supply unit connected to the first power domain, the current power supply unit being selected based on a current operating point of the first power domain, and the control unit controlling the current power supply unit to deliver a required voltage level associated with the current operating point of the first power domain, wherein the control unit is further configured to predefine a default voltage supply unit for each of the first power domain and the second power domain, among the first power supply unit and the second power supply unit, so that a sum of maximum drawn current values of power domains having the same default power supply unit is equal to the first or second maximum current deliverable by said same default supply unit;

wherein upon a change of an operating point of the first power domain from a first operating point to a second operating point, said second operating point requiring a second drawn current, if a required voltage level defined by the second operating point is higher than a required voltage level defined by the first operating point, and if the current power supply unit is unable to deliver the second drawn current, then the control unit is further configured to switch at least one other power domain among power domains connected to the current power supply unit of the first power domain to another power supply unit and to increase a voltage level of the current power supply unit up to the required voltage level defined by the second operating point of the first power domain.

2. The system of claim 1, wherein a minimum voltage level and a maximum voltage level are predefined for each of the first power supply unit and the second power supply unit, and the current power supply unit is selected by the control unit such that the required voltage level associated with the current operating point of the first power domain is comprised between the minimum and the maximum voltage levels of the current power supply unit.

3. The system according to claim 1, wherein the at least one power domain is part of a set comprising at least the second power domain, wherein each of the power domains in the set is arranged to be connected to a single voltage supply unit among the first power supply unit and the second power supply unit, and wherein each of the first power supply unit and the second power supply unit delivers a voltage, which is greater than or equal to a required supply voltage of a current operating point of each of the power domains in the set connected to said single supply voltage unit.

4. The system according to claim 1, wherein, upon a change of an operating point of the first power domain from a first operating point to a second operating point, said second operating point requiring a second drawn current, if a required voltage level defined by the second operating point is higher than a required voltage level defined by the first operating point, and if a second drawn current is drawn from the current power supply unit, then the control unit increases a voltage level of the current power supply unit up to the required voltage level for the second operating point of the first power domain.

5. The system according to claim 1, wherein upon a change of an operating point of a first power domain from a first operating point to a second operating point, said second operating point requiring a second drawn current, if a required voltage level for the second operating point is lower than a required voltage level for the first operating point, and if the required voltage level of each of other power domains currently connected to the current power supply unit is equal to or less than the required voltage level of said first power domain, then the control unit decreases the voltage level of the current power supply unit down to the required voltage level for the second operating point of the first power domain.

6. The system according to claim 5, wherein the control unit is further configured to reassign at least one other first power domain connected to another power supply unit from the current power supply unit of the first power domain, if the other first power domain is able to receive the decreased voltage level of the current power supply unit.

7. The system according to claim 1, wherein upon change of an operating point of a first power domain from a first operating point to a second operating point, said second operating point requiring a second drawn current, if a required voltage level for the second operating point is lower than a required voltage level for defined by the first operating point, and if the required voltage level of at least one of other power domains currently connected to the current power supply unit is greater than the required voltage level of said first power domain, then the control unit is configured to reassign said at least one other power domain to another power supply unit delivering a higher voltage level and to decrease the voltage level of the current power supply unit down to the required voltage level defined by the second operating point of the first power domain.

8. The system according to claim 1, wherein the control unit is further configured to set a voltage level delivered by any given power supply unit to a lowest of the required voltage levels of power domains that are currently connected to said given power supply unit.

9. A method of delivering a voltage to at least one power domain having at least one component and functioning according to at least two operating points at distinct required supply voltages in a system comprising at least a first and a second power supply unit, each supply unit being adapted to deliver a controllable supply voltage, and at least one first power domain, which is arranged to be alternatively connected to the first power supply unit or to the second power supply unit, the method being carried out by a control unit of the system and comprising:

selecting a current power supply unit among the first and second power supply units to be connected to the first power domain, the current power supply unit being selected based on a current operating point of the first power domain, and controlling a supply voltage delivered by the current power supply unit to deliver a required voltage level associated with the current operating point of the first power domain;

wherein a first maximum current is deliverable by the first voltage supply unit and a second maximum current is deliverable by the second voltage supply unit, wherein a maximum drawn current value is defined for each power domain, and the method further comprises for each power domain, predefining a default voltage supply unit among the first and second voltage supply units, so that a sum of maximum drawn current values of power domains having a same default power supply unit is less than the first or second maximum current deliverable b said same default supply unit;

wherein upon a change of an operating point of the first power domain from a first operating point to a second operating point, said second operating point requiring a second drawn current, if a required voltage level defined by the second operating point is higher than a required voltage level defined by the first operating point, and if the current power supply unit is unable to deliver the second drawn current, then the control unit is further configured to switch at least one other power domain among power domains connected to the current power supply unit of the first power domain to another power supply unit and to increase a voltage level of the current power supply unit up to the required voltage level defined by the second operating point of the first power domain.

10. The method according to claim 9, further comprising setting a voltage level of each given power supply unit to a lowest of the required voltage levels of power domains that are currently connected to said given power supply unit.

11. The method according to claim 9, wherein a minimum voltage level and a maximum voltage level are predefined for each of the first power supply unit and the second power supply unit, and the current power supply unit is selected such that the required voltage level associated with the current operating point of the first power domain is comprised between the minimum voltage level and the maximum voltage level of the current power supply unit.

12. A non-transitory computer readable medium having stored thereon computer program instructions loadable into a computing device, the computing device performing a method according to claim 9 when executing the computer program instructions.

* * * * *

UNITED STATES PATENT AND TRADEMARK OFFICE
CERTIFICATE OF CORRECTION

PATENT NO. : 9,716,383 B2  
APPLICATION NO. : 14/351169  
DATED : July 25, 2017  
INVENTOR(S) : Meunier et al.

Page 1 of 1

It is certified that error appears in the above-identified patent and that said Letters Patent is hereby corrected as shown below:

In the Specification

In Column 13, Line 18, delete "(IOPPPDM" and insert -- $(I_{oppPDM}$ --, therefor.

In the Claims

In Column 16, Line 64, in Claim 9, delete "b said" and insert -- by said --, therefor.

Signed and Sealed this  
Seventeenth Day of December, 2019

Andrei Iancu  
*Director of the United States Patent and Trademark Office*